United States Patent [19]

Kamide et al.

[11] Patent Number: 5,227,341
[45] Date of Patent: Jul. 13, 1993

[54] METHOD OF MANUFACTURING A SEMICONDUCTOR DEVICE USING AN ISOPROPYL ALCOHOL ASHING STEP

[75] Inventors: Yukihiro Kamide; Shingo Kadomura; Tetsuya Tatsumi, all of Kanagawa, Japan

[73] Assignee: Sony Corporation, Japan

[21] Appl. No.: 831,846

[22] Filed: Feb. 6, 1992

[30] Foreign Application Priority Data

Feb. 14, 1991 [JP] Japan .............................. P020635/91

[51] Int. Cl.$^5$ ...................... H01L 21/00; H01L 21/02; H01L 21/47; H01L 21/312
[52] U.S. Cl. .................................... 437/229; 437/245; 427/532; 427/533; 427/534; 156/646; 156/659.1
[58] Field of Search ................ 437/225, 228, 245, 229; 427/38, 39; 156/643, 646, 659.1

[56] References Cited

U.S. PATENT DOCUMENTS 3,988,256 10/1976 Vandermey et al. ............... 437/229
4,078,102 3/1978 Bendz et al. ........................ 156/626
4,992,108 2/1991 Ward et al. .......................... 430/329

FOREIGN PATENT DOCUMENTS 3821231 1/1989 Fed. Rep. of Germany .
0176723 10/1982 Japan .
0171006 10/1983 Japan .
0054896 3/1988 Japan .

*Primary Examiner*—Brian E. Hearn
*Assistant Examiner*—B. Everhart
*Attorney, Agent, or Firm*—Ronald P. Kananen

[57] ABSTRACT

An improved method of manufacturing a semiconductor device includes forming an insulating layer on a substrate, depositing a metal film layer on the insulating layer and depositing a photoresist layer on the metal film layer. The photoresist layer is formed with openings through which a predetermined surface of the metal film layer is exposed. The predetermined surface of the metal film layer is subjected to dry etching so that an underlying portion of the insulating layer is exposed. The remaining portion of the photoresist layer is then subjected to ashing by using an isopropyl alcohol-containing gas to expose the surface of said metal film layer.

7 Claims, 2 Drawing Sheets

METHOD OF MANUFACTURING A SEMICONDUCTOR DEVICE USING AN ISOPROPYL ALCOHOL ASHING STEP

BACKGROUND OF THE INVENTION

1. Field of the Invention

The present invention relates to a method of manufacturing a semiconductor device, and more specifically to an improved method of manufacturing a semiconductor device with corrosion resistivity, in which isopropyl alcohol-containing gas is employed for ashing of a photoresist mask layer, whereby corrosive chlorine resulting from an etching process is effectively removed.

2. Description of the Background Art

Aluminum or aluminum-containing alloy has been generally known as a material for a metal film which forms electrodes on a silicone substrate of semiconductor devices. In the manufacturing process for such semiconductor devices, the film made of aluminum or aluminum-containing alloy is subject to dry etching by using a chlorine-containing gas. After the dry etching, chlorine remains in the film and also in a photoresist layer formed on the film in the form of a chlorine-containing reaction product. Chlorine reacts with atmospheric moisture to generate hydrogen chloride HCl which causes corrosion of the film so that characteristics and performance of semiconductor device are deteriorated.

In order to prevent such corrosion of the aluminum film after dry etching, there have been proposed the following measures for removing chlorine remaining in the aluminum film.

One measure disclosed is that, after dry etching with chlorine gas, the aluminum film exposed through openings of the photoresist layer are further subjected to plasma etching using fluorine gas (such as CF4) such that chlorine remaining in the photoresist layer and the aluminum film is replaced with the fluorine in the fluorine gas. However, some chlorine remains unreplaced with fluorine.

Another measure disclosed is that, after dry etching with chlorine gas, the photoresist layer remaining on the aluminum film is subjected to in-line ashing to be removed from the aluminum film. However, a chlorine-containing reaction product, generated by the dry etching, still tends to remain in the aluminum film.

Still another measure disclosed is that, after the in-line ashing mentioned previously, the aluminum film exposed through the photoresist layer, is provided with a carbon-containing passivation layer which is formed by decomposition reaction with plasma gas such as CHF3. However, the passivation layer does not completely protect the aluminum film from exposure to atmospheric moisture which reacts with a chlorine-containing product remaining in the aluminum film.

Further, another measure disclosed is that after the in-line ashing described above, the aluminum film exposed through the photoresist layer is subject to baking under vacuum such that chlorine in a chlorine-containing reaction product remaining in the aluminum film, is removed. However, even in this case the chlorine is not completely removed from the aluminum film.

Therefore, there has been disclosed an alternative measure in which, upon the in-line ashing described above, a mixture of oxygen gas and methyl alcohol CH3OH is used as an ashing gas such that a chlorine-containing reaction product AlOxCly remaining in the aluminum film is decomposed by a reaction as indicated by the following equation:

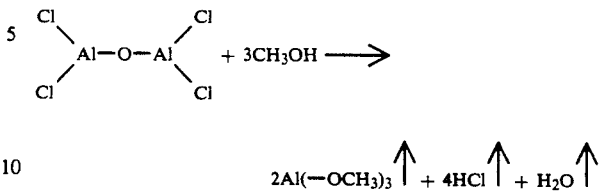

However, this measure, suffers from the drawback that, as the boiling point of Al(OCH3)3 is relatively high, i.e., about 240° C., the chlorine-containing reaction product AlOxCly is not readily decomposed nor removed from the aluminum film. Therefore, it must be heated at a high temperature after the ashing, in order to obtain an aluminum film having sufficient corrosion resistivity.

SUMMARY OF THE INVENTION

It is therefore a principal object of the present invention to provide an improved method of manufacturing a semiconductor device having increased corrosion resistivity.

According to one aspect of the present invention, there is provided a method of manufacturing a semiconductor device comprising steps of: forming an insulating layer on a substrate, depositing a metal film layer on the insulating layer, depositing a photoresist layer on the metal film layer, forming openings in the photoresist layer to expose a predetermined surface of the metal film layer therethrough, dry-etching the predetermined surface of the metal film layer to expose an underlying portion of the insulating layer, ashing the remaining portion of the photoresist layer by using an isopropyl alcohol-containing gas to expose the surface of the metal film layer.

BRIEF DESCRIPTION OF THE DRAWINGS

In the drawings:

FIGS. 1 through 4 are sectional views illustrating a sequence of steps of the method of the present invention, in which FIG. 3 shows a dry etching step and FIG. 4 shows an ashing step following the dry etching step in FIG. 3.

DESCRIPTION OF THE PREFERRED EMBODIMENT

Figure 1:
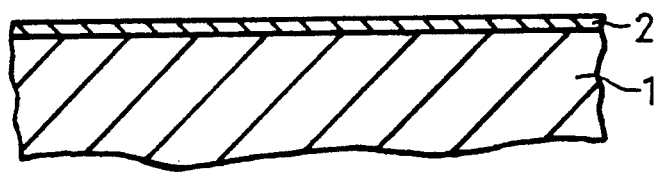
Figure 2:
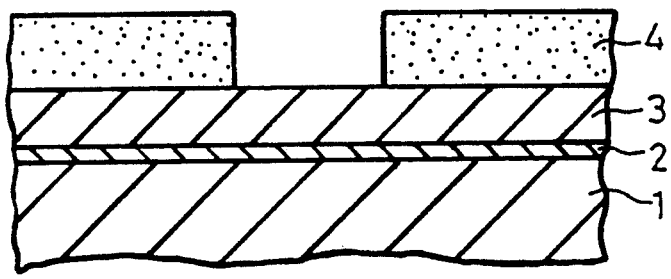
Figure 3:
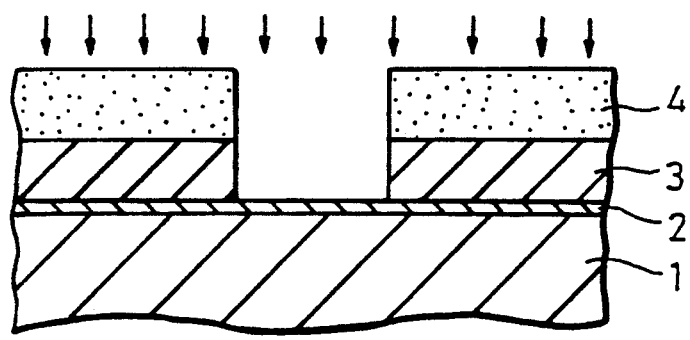

Referring to FIG. 1, there is shown a substrate 1 which may be made of monocrystalline silicon. On the substrate 1 is formed a layer 2 of an insulating material, preferably silicon dioxide SiO2. As shown in FIG. 2, an aluminum film 3 is deposited on the SiO2 insulating layer 2 formed on the silicon substrate 1. The aluminum film 3 is coated with a layer 4 of a photoresist material which is used as a mask for a subsequent etching process. Using standard photolithographic techniques, the photoresist layer 4 is partially removed such that the aluminum film 3 is exposed as shown in FIG. 2. The exposed aluminum film 3 is partially removed dry etching by using a mixture of chlorine gas Cl2 and nitrogen gas N2 such that the SiO2 insulating layer 2 is exposed through openings of the aluminum film 3.

Figure 4:
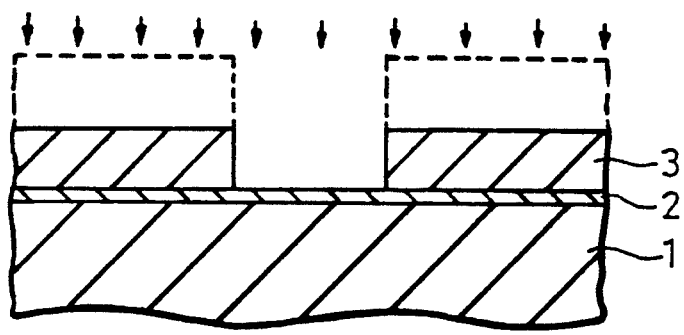

As shown in FIG. 4, after dry etching, the photoresist layer 4 remaining on the aluminum film 3 is subject to ashing by using an isopropyl alcohol-containing gas by means of an ashing apparatus of a generally known microwave down flow type. Thus, a chlorine-containing reaction product which remains in the aluminum film after the dry etching process, is decomposed as indicated by the following equation.

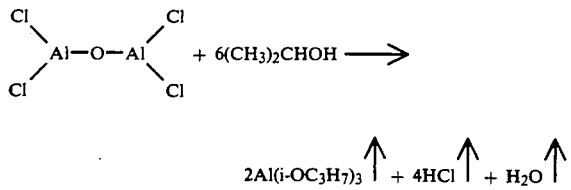

As indicated by the equation, $H_2O$, hydrogen chloride HCl and tri-isopropoxy aluminum $Al(i-OC_3H_7)_3$ are generated during the ashing process. Since the boiling point of $Al(i-OC_3H_7)_3$ is relatively low, i.e., about 130° C., it is readily evaporated by heating and removed from the aluminum film as well as $H_2O$ and HCl.

A more complete and clear understanding of the method of the present invention may be obtained by reference to the following example.

EXAMPLE

Two samples were prepared according to the aforementioned steps from formation of the insulating layer to dry etching of the aluminum film. Sample A was subject to ashing by means of an ashing apparatus of a microwave down flow type, under the following conditions. A mixture of $200_{SCCM}$ of oxygen gas $O_2$ and $40_{SCCM}$ of isopropyl alcohol $(CH_3)_2CHOH$ was used as an ashing gas, under a pressure of 1.2 Torr. Microwaving was applied at 400 mA.

Sample B which was used as a control, was subject to ashing by means of the same apparatus under the following conditions. A mixture of $200_{SCCM}$ of oxygen gas $O_2$ and $40_{SCCM}$ of methyl alcohol $(CH_3OH)$ was used as an ashing gas, under a pressure of 1.2 Torr. Microwaving was applied at 400 mA.

The samples A and B were successively observed with respect to corrosion caused by chlorine remaining therein after the dry etching. With the lapse of time, no corrosion was found in the sample A while serious corrosion was found in the sample B.

The ashing gas used in the above example may further contain fluorine. In addition to such use of an ashing gas containing fluorine, a silicon wafer placed on a stage and heated in order to further increase corrosion resistivity of an aluminum film.

The aluminum film used for the samples in the foregoing example may be replaced by a film made of aluminum alloy, for instance, Al-Si or Al-Cu. In this case, dry etching may be carried out by using a mixture of fluorine gas and chlorine gas.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method of manufacturing a semiconductor device comprising the steps of:
    forming an insulating layer on a substrate;
    depositing a metal film on said insulating layer;
    depositing a photoresist layer on said metal film layer;
    forming an opening in said photoresist layer to expose a surface of said metal film layer therethrough;
    dry-etching said surface of said metal film layer to expose an underlying portion of said insulating layer; and
    ashing the remaining portion of said photoresist layer by using an isopropyl alcohol-containing gas to expose the surface of said metal film layer.

2. A method as claimed in claim 1, wherein said substrate is made of monocrystalline silicon.

3. A method as claimed in claim 1, wherein said insulating layer is made of silicon dioxide.

4. A method as claimed in claim 1, wherein said metal film layer is made of one selected from a group consisting of aluminum and an aluminum-containing alloy.

5. A method as claimed in claim 4, wherein said aluminum alloy is selected from aluminum/silicon alloy and/or aluminum/copper alloy.

6. A method as claimed in claim 1, wherein said isopropyl alcohol-containing gas further comprises oxygen.

7. A method as claimed in claim 6, wherein said isopropyl alcohol-containing gas further comprises fluorine.

* * * * *